United States Patent
Kuriyama

(10) Patent No.: US 8,493,795 B2
(45) Date of Patent: Jul. 23, 2013

(54) VOLTAGE STABILIZATION DEVICE AND SEMICONDUCTOR DEVICE INCLUDING THE SAME, AND VOLTAGE GENERATION METHOD

(75) Inventor: Masao Kuriyama, Yokohama (JP)

(73) Assignee: Samsung Electronics Co., Ltd. (KR)

( * ) Notice: Subject to any disclaimer, the term of this patent is extended or adjusted under 35 U.S.C. 154(b) by 259 days.

(21) Appl. No.: 12/971,339

(22) Filed: Dec. 17, 2010

(65) Prior Publication Data

US 2011/0157976 A1 Jun. 30, 2011

(30) Foreign Application Priority Data

Dec. 24, 2009 (JP) ................................. 2009-292316
Mar. 26, 2010 (KR) ........................ 10-2010-0027453

(51) Int. Cl.
*G11C 11/4074* (2006.01)
(52) U.S. Cl.
USPC .................. 365/185.27; 365/185.23; 365/226
(58) Field of Classification Search
USPC ........ 365/185.23, 185.27, 226; 323/311–317; 361/18; 327/541
See application file for complete search history.

(56) References Cited

U.S. PATENT DOCUMENTS

| | | | | |
|---|---|---|---|---|
| 5,077,518 A | * | 12/1991 | Han | 323/275 |
| 2006/0087886 A1 | * | 4/2006 | Cho et al. | 365/185.18 |
| 2007/0109876 A1 | * | 5/2007 | Umezawa | 365/189.09 |
| 2008/0191790 A1 | * | 8/2008 | Brox | 327/540 |
| 2008/0278124 A1 | * | 11/2008 | Aiura et al. | 323/267 |
| 2008/0298136 A1 | * | 12/2008 | Yamauchi et al. | 365/185.29 |
| 2012/0153723 A1 | * | 6/2012 | Van Dijk | 307/31 |

FOREIGN PATENT DOCUMENTS

| | | |
|---|---|---|
| JP | 11-145413 | 5/1999 |
| JP | 2002-237187 | 8/2002 |
| JP | 2008-172946 | 7/2008 |
| JP | 2008-305499 | 12/2008 |

* cited by examiner

*Primary Examiner* — Douglas King
(74) *Attorney, Agent, or Firm* — Myers Bigel Sibley & Sajovec, P.A.

(57) ABSTRACT

Integrated circuit memory devices include multiple voltage regulators configured to generate respective boosted voltages, which are provided to a memory cell block. A first voltage regulator is configured to increase a well voltage (Vwell) from a first level to an elevated second level during a pull-up time interval when a boosted well voltage level is required within a memory cell block. The increase in the level of the well voltage occurs in response to a transition of a trim signal (Trim) received at an input of the first voltage regulator. A second voltage regulator is also provided. The second voltage regulator is configured to increase a word line voltage (Vwl) from a third level to an elevated fourth level during the pull-up time interval, in response to the transition of the trim signal and in response to the well voltage. A memory cell block is provided, which is configured to receive the well voltage and the word line voltage during the pull-up time interval.

12 Claims, 15 Drawing Sheets

VOLTAGE STABILIZATION DEVICE AND SEMICONDUCTOR DEVICE INCLUDING THE SAME, AND VOLTAGE GENERATION METHOD

REFERENCE TO PRIORITY APPLICATIONS

This application claims priority to Japanese Patent Application 2009-292316, filed Dec. 24, 2009 and to Korean Patent Application No. 10-2010-0027453, filed Mar. 26, 2010, the contents of which are hereby incorporated herein by reference.

FIELD OF THE INVENTION

The present invention relates to semiconductor devices and, more particularly, to voltage stabilization devices and semiconductor devices including the same.

BACKGROUND

In a NOR flash memory being a kind of nonvolatile semiconductor, for example, a Multi Level Cell (MLC) scheme may be used which stores 2 bits in one cell. In a memory using the MLC scheme, as illustrated in FIG. 5, a threshold voltage Vt of a memory cell storing data corresponds to each data state. FIG. 5 illustrates a distribution of the threshold voltage of the NOR flash memory using the MLC scheme. In FIG. 5, the abscissa axis represents the threshold voltage Vt, and the ordinate axis represents the number of memory cells. Memory cells corresponding to data of 11 have a threshold voltage equal to or less than a voltage R1. Memory cells corresponding to data of 10 have a threshold voltage greater than the voltage R1 and less than a voltage R2. Memory cells corresponding to data of 01 have a threshold voltage greater than the voltage R2 and less than a voltage R3. Memory cells corresponding to data of 00 have a threshold voltage equal to or greater than a voltage R3.

When a reading operation is performed for memory cells using the MLC scheme, by controlling a voltage applied to the word line (WL) of a memory cell array in multi steps, the data of an accessed memory cell is determined. FIG. 6 is a diagram illustrating the change of a voltage Vg (i.e., a voltage Vg which is applied to a gate of a memory cell) applied through a word line with time.

A voltage Vg1 is one that is applied to a word line (WL) for determining a memory cell having a threshold voltage which corresponds to 11 and a memory cell having a threshold voltage which corresponds to 10 or a threshold voltage equal to or greater than it. A voltage Vg2 is one that is applied to a word line (WL) for determining a memory cell having a threshold voltage which corresponds to 10 or a threshold voltage equal to or less than it and a memory cell having a threshold voltage which corresponds to 01 or a threshold voltage equal to or greater than it. A voltage Vg3 is one that is applied to a word line (WL) for determining a memory cell having a threshold voltage which corresponds to 01 or a threshold voltage equal to or less than it and a memory cell having a threshold voltage which corresponds to 00.

For implementing the NOR flash memory using the MLC scheme, a word line decoder for driving a memory cell needs operate at a high speed. Such an operation time is one of important factors for determining a read speed.

A word line decoder of FIG. 7 is used in a speeding-up method. A word line decoder 120 of a memory cell array 110 separates a well voltage Vwell and a source voltage Vwl, thereby minimizing a capacity that is driven with the source voltage Vwl. As a result, a driving speed is sped up when a word line level is shifted as illustrated in FIG. 6. In this configuration, a potential relationship of "Vwell≧Vwl" is always required for suppressing the current of a pn direction in the word line decoder 120. FIG. 8 illustrates relationships between a word line driving voltage Vg, a well voltage Vwell and a source voltage Vwl in a reading operation. In FIG. 8, the well voltage Vwell is controlled with a certain value, and the source voltage Vwl is controlled to incrementally be changed. In this way, by controlling the well voltage Vwell with a certain value and simultaneously changing only the source voltage Vwl having a small driving capacity, a time necessary for operation is shortened.

Moreover, a semiconductor device 100 in FIG. 7 includes a plurality of blocks 101-0 to 101-i, a global bit line selection block 102, and a sense amplifier block 103. Each of the blocks 101-0 to 101-i include a memory cell array 110, and the memory cell array 110 includes nonvolatile memory cells 111 using an MLC scheme. Each of the blocks 101-1 to 101-i include a word line decoder 120 and a local bit line selection block 130.

The memory cell array 110 includes a plurality of nonvolatile memory cells 111 using the MLC scheme. The gate of the each nonvolatile memory cell 111 is connected to a word line WL, and the drain of the each nonvolatile memory cell 111 is connected to a local bit line LBL.

The word line decoder 120 includes a plurality of word line drivers that have a PMOS transistor 121 and an NMOS transistor 122. In this case, the source voltage Vwl and the well voltage Vwell are applied to the source and well of the PMOS transistor 121, respectively.

The local bit line selection block 130 includes a plurality of NMOS transistors 131 that connect a local bit line selected from among local bit lines LBL to a global bit line GBL. In this case, signals YL0 and YL1 are applied to the gates of the NMOS transistors 131, respectively.

The global bit line selection block 102 includes a plurality of NMOS transistors 141 for selecting global bit lines GBL. In this case, signals YG0 and YG1 are applied to the gates of the NMOS transistors 141, respectively.

The sense amplifier block 103 includes a plurality of sense amplifiers 151. The sense amplifiers 151 amplify data that is transferred through a selected global bit line, and a global bit line is selected by the global bit line selection block 102.

When a writing operation is performed, the level of a word line need be set as a higher potential than the potential of a word line in a reading operation. Accordingly, for example, when being changed from a reading state to a writing state, a source voltage Vwl and a well voltage Vwell need be shifted to have a higher potential together. In this case, the capacity of the well voltage Vwell is much greater than that of the source voltage Vwl. Accordingly, for example, as illustrated in FIG. 9, a state of "Vwell<Vwl" is easily generated in a regulator that has the same control and driving ability. That is, the reverse of a pn potential is easily generated. When the reverse of the pn potential exceeds a diode order direction potential Vf, a severe failure of a device is caused. Accordingly, scrupulous care is required in designing.

FIG. 9 illustrates an example where a word line driving voltage Vg, a well voltage Vwell and a source voltage Vwl are shifted with time in a writing operation. The following first and second methods are examples of a method that shifts the potential level of a source voltage Vwl and the potential level of a well voltage Vwell while maintaining a relationship of "Vwell≧Vwl".

As illustrated in FIG. 10, a well voltage Vwell is first charged. The charging of the well voltage Vwell is completed, and then the charging operation of a source voltage Vwll is started. In such a method, times are required for completing the charging of the well voltage Vwell and well voltage Vwell.

As illustrated in FIG. 11, a source voltage Vwl is outputted to always maintain a relationship of "Vwell≧Vwl" based on the driving capacity of a source voltage Vwl, the driving capacity of a well voltage Vwell and wiring delay. The driving ability of a regulator for satisfying this or the driving ability of a regulator for outputting the well voltage Vwell is designed. In this case, there is a requirement for satisfying all factors such as the operating condition of the source voltage Vwl, the operating condition of the well voltage Vwell, an external temperature and the manufacturing deviation of an element in a chip. Accordingly, it is difficult to design a circuit.

FIGS. 10 and 11 illustrate an example where a word line driving voltage Vg, a well voltage Vwell and a source voltage Vwl are shifted with time in the first and second methods.

An example of configuration of a power source circuit for implementing the first or second method will be described below with reference to FIG. 12. FIG. 12 is a circuit diagram illustrating the configuration of a voltage stabilization device 50. The voltage stabilization device 50 may be referred to as a regulator 50. The regulator 50 includes an operational amplifier 51, a PMOS transistor 52, a resistor 53, a resistor 54, a PMOS transistor 55, and a level shifter circuit (LS) 56.

A reference voltage Vref5 is applied to the non-inversion input terminal of the operational amplifier 51. A connection node between the serially-connected resistors 53 and 54 is connected to the inversion input terminal of the operational amplifier 51. The output terminal of the operational amplifier 51 is connected to the gate of the PMOS transistor 52. The source of the PMOS transistor 52 is connected to a power source supplying a voltage Vh, and the drain of the PMOS transistor 52 is connected to the resistor 53. The PMOS transistor 52 is an active load for an output voltage Vwl. That is, the drain of the PMOS transistor 52 is connected to the output voltage Vwl. The resistor 54 is connected to a ground terminal.

The level shift circuit 56 shifts the level of a trim signal by using a voltage (i.e., Vwl) applied from the resistor 53 as a power source voltage. The level shift circuit 56 turns on/off the PMOS transistor 55 according to the level of the trim signal. When the trim signal has a high level (H), the PMOS transistor 55 is turned on. When the trim signal has a low level (L), the PMOS transistor 55 is turned off. The drain and source of the PMOS transistor 55 are connected to certain two points of the resistor 53. A resistance-divided voltage ratio (or resistance division ratio) by the resistors 53 and 54 is changed according to the turn-on/off of the PMOS transistor 55.

In the regulator 50, the operational amplifier 51 compares a difference between the reference voltage Vref5 and the resistance-divided voltage of the output voltage Vwl, and controls a voltage that is applied to the gate of the PMOS transistor 52 according to the compared result. Accordingly, a constant output voltage Vwl is maintained.

The output voltage Vwl is shifted. In this case, a resistance-divided voltage ratio is changed by a trim signal. The second method adjusts the gate width of the PMOS transistor 52 to adjust a charging performance. The first method adjusts timing when the output voltage Vwl is activated or timing (which is the changed timing of the trim signal) when a resistance-divided voltage ratio is changed. In a case of designing in the first or second method in order for the reverse of a pn potential not to occur, it is difficult to control a power source in a short time.

A related art has been disclosed in patent documents 1 to 4. In the patent document 1, when an internal voltage VI1 applied to a well and an internal voltage applied to a source are generated, the internal voltage VI1 is generated by a first step-down circuit and the internal voltage VI2 is generated by a second step-down circuit (see FIG. 1 and FIG. 6B of the patent document 1). Technology that shortens the charging time of a load capacity by the internal voltage VI2 has been disclosed in the FIG. 2 and paragraph 0028 to 0031 of the patent document 1.

In a case of designing in the first or second method in order for the reverse of a pn potential not to occur, it is difficult to control a power source in a short time. Also, as described in the patent document 1, in a case that uses the output (first voltage) of a first step-down circuit as the power source of a second step-down circuit among two step-down circuits, the charging performance of a second voltage is degraded when the output (second voltage) of the second step-down circuit approaches the first voltage.

SUMMARY

Integrated circuit memory devices according to embodiments of the invention include multiple voltage regulators configured to generate respective boosted voltages that are provided to a memory cell block (e.g., nonvolatile memory cell block). In some of these embodiments of the invention, a memory device includes a first voltage regulator. This first voltage regulator is configured to increase a well voltage (Vwell) from a first level to an elevated second level during a pull-up time interval when a boosted well voltage level is required within a memory cell block. In particular, the increase in the level of the well voltage occurs in response to a transition of a trim signal (Trim) received at an input of the first voltage regulator. A second voltage regulator is also provided. The second voltage regulator is configured to increase a word line voltage (Vwl) from a third level to an elevated fourth level during the pull-up time interval, in response to the transition of the trim signal and in response to the well voltage. A memory cell block is provided, which is configured to receive the well voltage and the word line voltage during the pull-up time interval.

According to additional embodiments of the invention, the second voltage regulator is powered by different voltage sources. In particular, the second voltage regulator can be configured to switch from sinking (i.e., receiving) current from the first voltage regulator during a leading portion of the pull-up time interval to sinking current from a power supply line (e.g., Vh) during a trailing portion of the pull-up time interval. In these embodiments, the voltage of the power supply line is greater than the well voltage and the second voltage regulator includes a PMOS pull-up transistor having a source terminal that receives the well voltage. According to additional aspects of these embodiments of the invention, the memory cell block includes a PMOS pull-up transistor having a source terminal responsive to the word line voltage, a drain terminal electrically coupled to a word line and a substrate bias terminal responsive to the well voltage.

According to additional embodiments of the invention, the first voltage regulator is configured to switch a regulator control signal (e.g., Reg2_OK) from a first logic state to a second logic state in response to determining that a voltage level of the well voltage has exceeded a threshold voltage level, which may be detected by a determination unit. In response to this transition of the regulator control signal, the second voltage regulator switches from sinking current from the first voltage regulator to sinking current from a power source. According to still further embodiments of the invention, each of the first and second voltage regulators may include a respective PMOS pull-up transistor (e.g., 12, 42/46) having a source terminal electrically coupled to the power supply line. In addition, the memory cell block may include a non-volatile memory cell having a control terminal electrically coupled to the word line. This non-volatile memory cell may include an EEPROM cell or a charge-trap memory cell.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

Exemplary embodiments of the inventive concept will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

Figure 1:
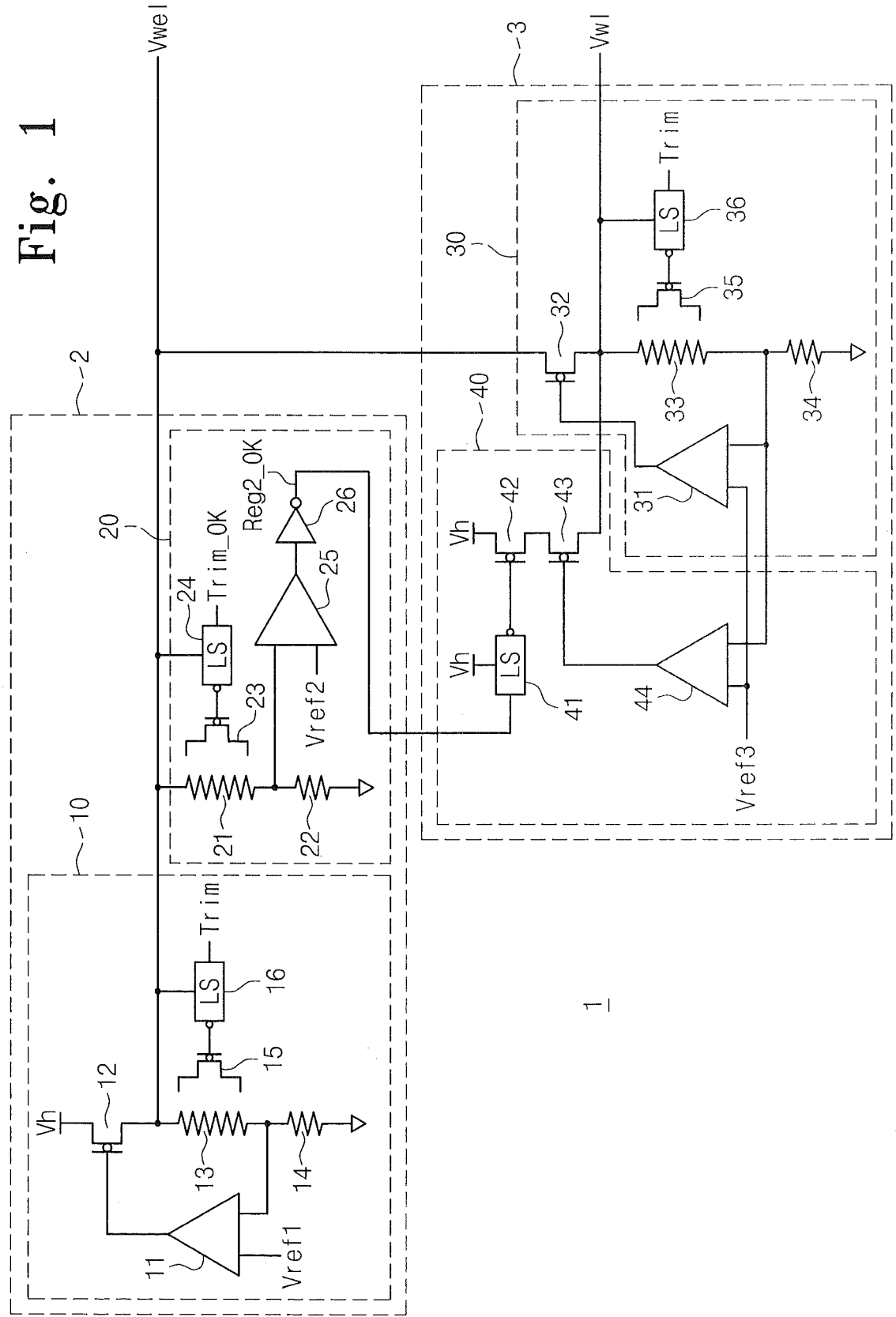
FIG. 1 is a circuit diagram illustrating a regulator according to an embodiment of the inventive concept.

FIG. 1 is a circuit diagram illustrating a regulator device according to an embodiment of the inventive concept. A regulator device 1 of FIG. 1 includes a first regulator 2 and a second regulator 3.

Figure 7:
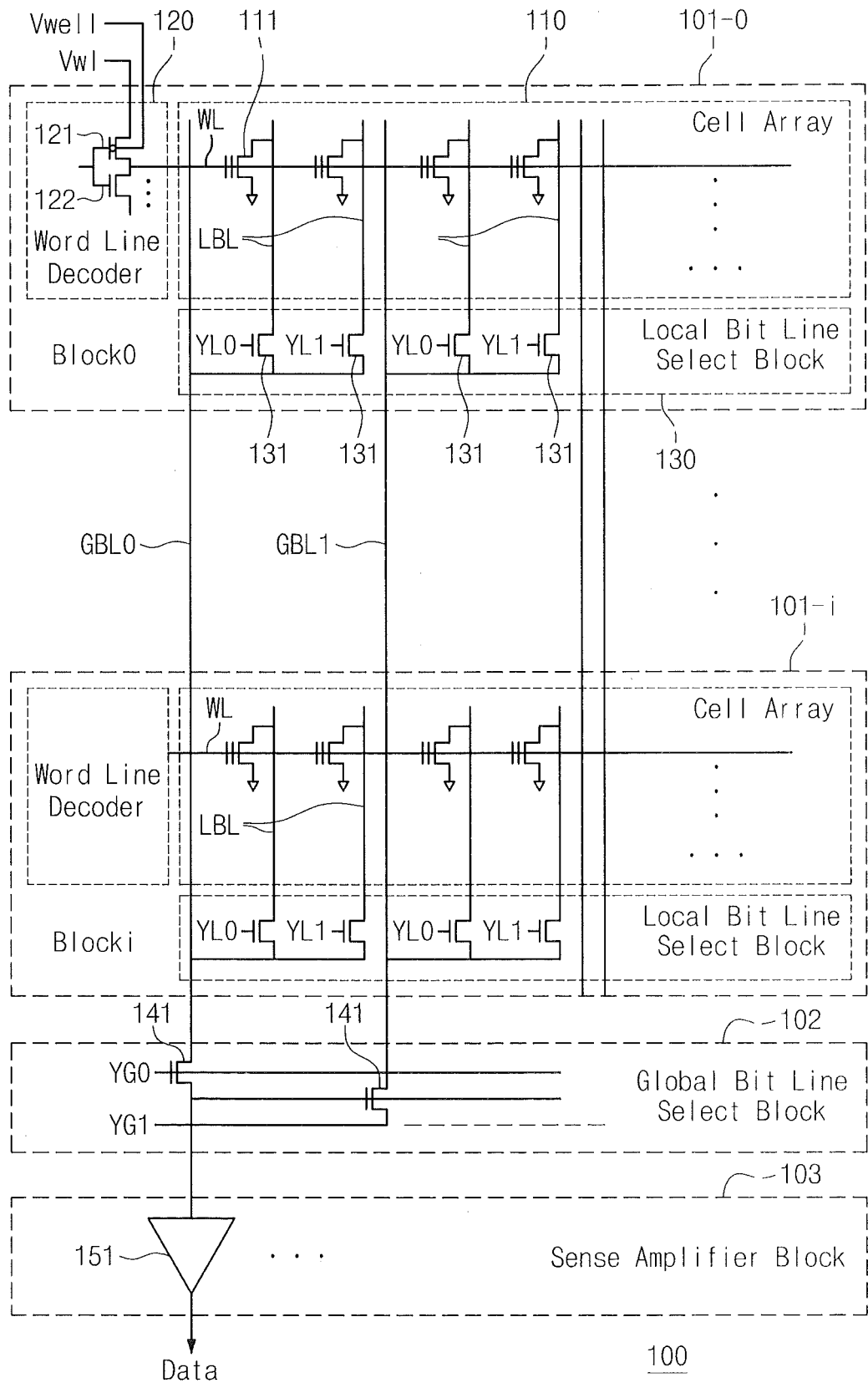
FIG. 7 illustrates a nonvolatile memory cell array and a peripheral circuit.
Figure 8:
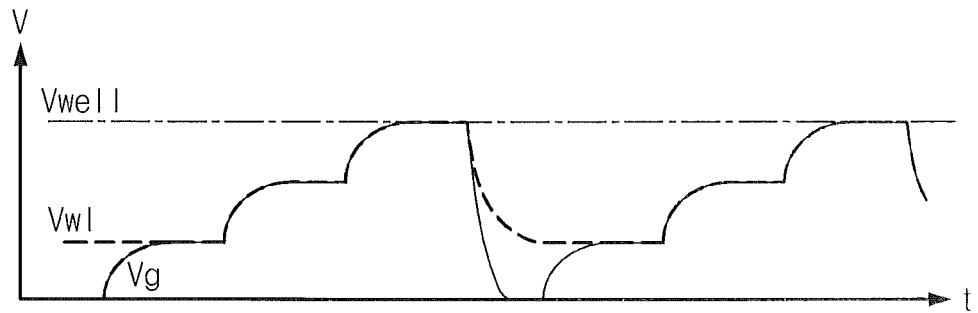
FIG. 8 illustrates an example for controlling a well voltage and a source voltage in a reading operation in an MLC scheme.
Figure 9:
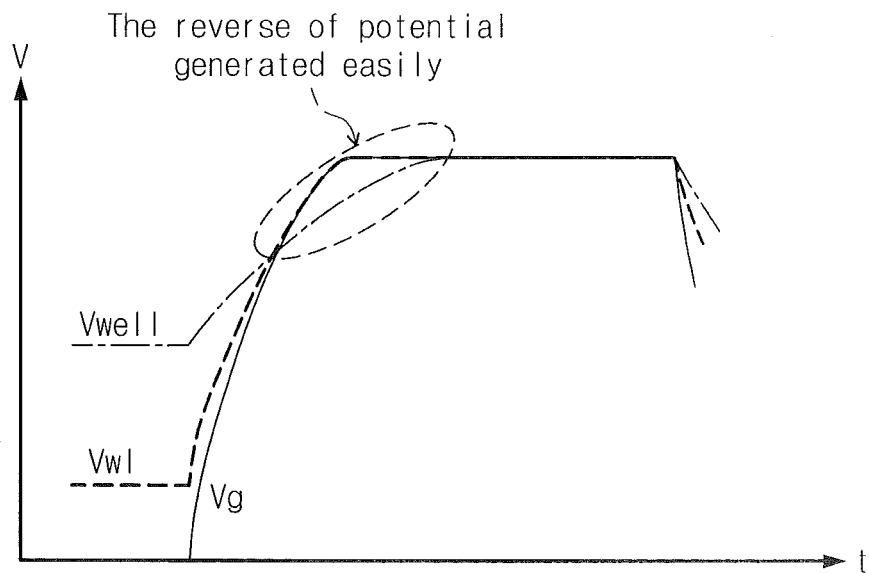
FIG. 9 illustrates an example for controlling a well voltage and a source voltage in a writing operation.
Figure 10:
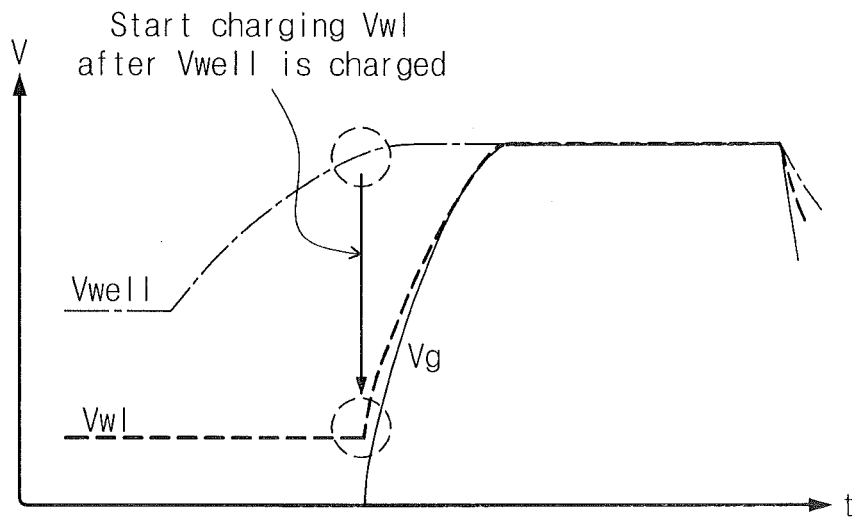
FIG. 10 illustrates an example for controlling a voltage in a first method.
Figure 11:
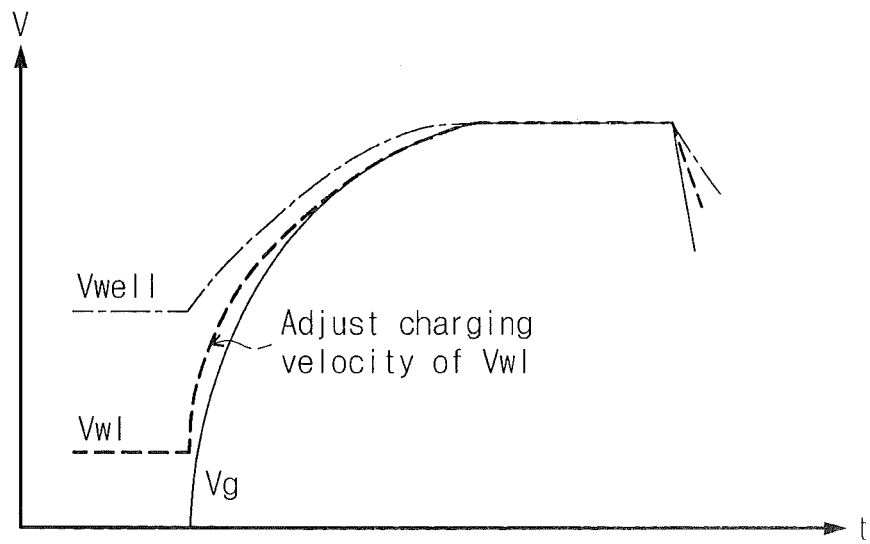
FIG. 11 illustrates an example for controlling a voltage in a second method.
Figure 12:
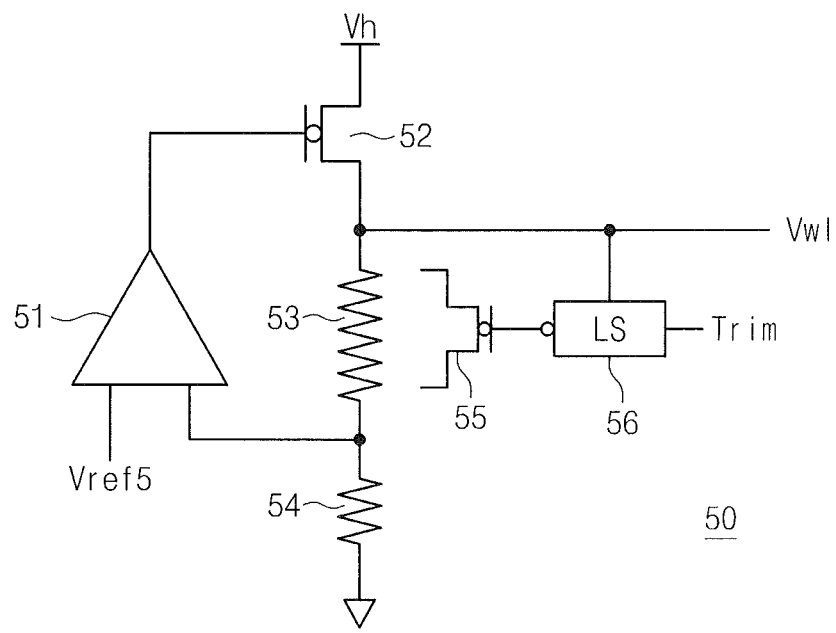
FIG. 12 illustrates an example of configuration of a regulator.

The first regulator 2 generates a well voltage Vwell, which is applied to the well of a PMOS transistor 121 in FIG. 7, by using a voltage Vh as a power source. The well voltage Vwell generated by the first regulator 2 may be referred to as a first output voltage Vwell.

The second regulator 3 generates a source voltage Vwl, which is applied to the source of the PMOS transistor 121 in FIG. 7, by using the voltage Vh and/or the well voltage Vwell generated by the first regulator 2 as a power source. The source voltage Vwl generated by the second regulator 3 may be referred to as a second output voltage Vwl.

The first regulator 2 includes a first voltage generation unit 10 and a determination unit 20. The first voltage generation unit 10 includes an operational amplifier 11, a PMOS transistor 12, a resistor 13, a resistor 14, a PMOS transistor 15, and a level shift circuit 16.

A reference voltage Vref1 is applied to the non-inversion input terminal of the operational amplifier 11. A connection node between the serially-connected resistors 13 and 14 is connected to the inversion input terminal of the operational amplifier 11. The output terminal of the operational amplifier 11 is connected to the gate of the PMOS transistor 12.

The source of the PMOS transistor 12 is connected to a power source supplying the voltage Vh. The drain of the PMOS transistor 12 is connected to the resistor 13. The PMOS transistor 12 is an active load for the voltage output of the well voltage Vwell. That is, the drain of the PMOS transistor 12 is connected to the output terminal of the first output voltage Vwell. The resistor 14 is connected to a ground terminal.

The level shift circuit 16 shifts the level of a trim signal by using a voltage (i.e., the first output voltage Vwell) applied from the resistor 13 as a power source voltage. The level shift circuit 16 turns on/off the PMOS transistor 15 according to the level of the trim signal. When the trim signal has a high level (H), the PMOS transistor 15 is turned on. When the trim signal has a low level (L), the PMOS transistor 15 is turned off. The drain and source of the PMOS transistor 15 are connected to certain two points of the resistor 13. A resistance-divided voltage ratio by the resistors 13 and 14 is changed according to the turn-on/off of the PMOS transistor 15.

In the first voltage generation unit 10, the operational amplifier 11 compares a difference between the reference voltage Vref1 and the resistance-divided voltage of the first output voltage Vwell, and controls a voltage that is applied to the gate of the PMOS transistor 12 according to the compared result. Accordingly, the first output voltage Vwell is maintained at a constant level. When the first output voltage Vwell is shifted, a resistance-divided voltage ratio is changed by the trim signal. In this case, the first output voltage Vwell is shifted to a high voltage when the trim signal has a low level (L).

The determination unit 20 includes a resistor 21, a resistor 22, a PMOS transistor 23, a level shift circuit 24, a comparator 26, and an inverter 26. The one end of the resistor 21 is connected to the drain of the PMOS transistor 12. That is, the one end of the resistor 21 is connected to the output terminal of the first output voltage Vwell. The other end of the resistor 21 is connected to the one end of the resistor 22. The other end of the resistor 22 is connected to a ground terminal.

The level shift circuit 24 shifts the level of a signal Trim_OK by using a voltage (i.e., the first output voltage Vwell) applied from the resistor 21 as a power source voltage. The level shift circuit 24 turns on/off the PMOS transistor 23 according to the level of the signal Trim_OK. When the signal Trim_OK has a high level (H), the PMOS transistor 23 is turned on. When the signal Trim_OK has a low level (L), the PMOS transistor 23 is turned off. The drain and source of the PMOS transistor 23 are connected to certain two points of the resistor 21.

The comparator 25 compares a reference voltage Vref2 and a voltage that is obtained by dividing the first output voltage Vwell by the resistors 21 and 22. The comparator 25 outputs a signal having a low level (L) when the divided voltage is greater than the reference voltage Vref2.

The inverter 26 inverts the output of the comparator 25. The output of the inverter 26 is a signal Reg2_OK. The signal Reg2_OK has a high level when the first output voltage Vwell is greater than a predetermined level.

The second regulator 3 includes a second voltage generation unit 30 and a third voltage generation unit 40. The second voltage generation unit 30 includes an operational amplifier 31, a PMOS transistor 32, a resistor 33, a resistor 34, a PMOS transistor 35, and a level shift circuit 36.

A reference voltage Vref3 is applied to the non-inversion input terminal of the operational amplifier 31. A connection node between the serially-connected resistors 33 and 34 is connected to the inversion input terminal of the operational amplifier 31. The output terminal of the operational amplifier 31 is connected to the gate of the PMOS transistor 32.

The source of the PMOS transistor 32 is connected to the output terminal of the first voltage generation unit 10. That is, the source of the PMOS transistor 32 is connected to the first output voltage Vwell. The drain of the PMOS transistor 32 is connected to the resistor 33. The PMOS transistor 32 is an active load for the second output voltage Vwl. That is, the drain of the PMOS transistor 32 is the output terminal of the second output voltage Vwl. The resistor 34 is connected to the ground terminal.

The level shift circuit 36 shifts the level of a trim signal by using a voltage (i.e., the second output voltage Vwl) applied from the resistor 33 as a power source voltage. The level shift circuit 36 turns on/off the PMOS transistor 35 according to the level of the trim signal. When the trim signal has a high level (H), the PMOS transistor 35 is turned on. When the trim signal has a low level (L), the PMOS transistor 35 is turned off. The drain and source of the PMOS transistor 35 are connected to certain two points of the resistor 33. A resistance-divided voltage ratio by the resistors 33 and 34 is changed according to the turn-on/off of the PMOS transistor 15.

In the second voltage generation unit 30, the operational amplifier 31 compares a difference between the reference voltage Vref3 and the resistance-divided voltage of the second output voltage Vwl, and controls a voltage that is applied to the gate of the PMOS transistor 32 according to the compared result. Accordingly, the second output voltage Vwl is maintained at a constant level. When the second output voltage Vwl is shifted, a resistance-divided voltage ratio is changed by the trim signal. In this case, the second output voltage Vwl is shifted to the same high voltage as the first output voltage Vwell.

The third voltage generation unit 40 includes a level shift circuit 41, a PMOS transistor 42, a PMOS transistor 43, and an operational amplifier 44.

The level shift circuit 41 shifts the level of a signal Reg2_OK by using the voltage Vh as a power source voltage. The level shift circuit 41 turns on/off the PMOS transistor 42 according to the level of the signal Reg2_OK. When the signal Reg2_OK has a high level (H), the PMOS transistor 42 is turned on. When the signal Reg2_OK has a low level (L), the PMOS transistor 42 is turned off. The source of the PMOS transistor 42 is connected to the voltage Vh. The drain of the PMOS transistor 42 is connected to the source of the PMOS transistor 42.

The reference voltage Vref3 is applied to the non-inversion input terminal of the operational amplifier 44. A connection node between the serially-connected resistors 33 and 34 is connected to the inversion input terminal of the operational amplifier 44. The output terminal of the operational amplifier 44 is connected to the gate of the PMOS transistor 43. The PMOS transistor 43 is an active load for the second output voltage Vwl. That is, the drain of PMOS transistor 43 is connected to the drain of the PMOS transistor 32 and is the output terminal of the second output voltage Vwl.

In the third voltage generation unit 40, the operational amplifier 44 compares a difference between the reference voltage Vref3 and the resistance-divided voltage of the second output voltage Vwl, and controls the gate voltage of the PMOS transistor 43 according to the compared result. Accordingly, the second output voltage Vwl is maintained at a constant level.

The following description will be made on an operation when the control potential of the first regulator 2 and the control potential of the second regulator 3 are shifted in charging.

In the initial stage of charging, the first output voltage Vwell of the first regulator 2 is used as the output driving power source of the second regulator 3. Accordingly, a relationship of "Vwell≧Vwl" is clearly performed, and the first output voltage Vwell may be charged at a high speed. However, since the upper limit of a power source is the level of the first output voltage Vwell, the charging performance of the second regulator 3 is degraded when the level of the second output voltage Vwl approaches the level of the first output voltage Vwell.

When the output of the first regulator 2 reaches a certain voltage level, the second regulator 3 uses the voltage Vh higher than the first output voltage Vwell as the output driving power source of the second regulator 3. Herein, when the signal Reg2_OK has a high level (H), this represents that the output of the first regulator 2 is equal to or higher than a certain voltage level.

Referring to FIG. 1, when the signal Reg2-OK has a high level (H), the PMOS transistor 42 is turned on. When the PMOS transistor 42 is turned on, the source of the PMOS transistor 43 is connected to the voltage Vh. The PMOS transistor 43 is controlled by the operational amplifier 44. The drain of the PMOS transistor 43 outputs the second output voltage Vwl. In this case, although the second voltage generation unit 20 using the first output voltage Vwell as a power source is continuously used after the Reg2_OK signal is shifted to a high level (H), the second output voltage Vwl is controlled by the third voltage generation unit 40 to have a certain value.

In a stage where the signal Reg2_OK is shifted to a high level (H), since the first output voltage Vwell increases sufficiently, the potential reverse of the first and second output voltages Vwell and Vwl does not occur. In other words, even when charging is performed using the voltage Vh as a power source, the level of the signal Reg2_OK is set as a voltage level where the potential reverse of the first and second output voltages Vwell and Vwl does not occur.

Moreover, the third voltage generation unit 40 performs a charging operation with the voltage Vh, and may have a current supplying ability for performing charging to the second output voltage Vwl being a target voltage. Consequently, although the potentials of the first and second output voltages Vwell and Vwl are simultaneously shifted, a relationship of "Vwell≧Vwl" is maintained and a potential may be shifted at a high speed.

By using the signal Reg2_OK outputted from the first regulator 2, a potential may be shifted without the detection of the second output voltage Vwl. On the other hand, when the output voltage Vwl of the second regulator 3 is detected and the power source voltage of the second regulator 3 is shifted from the first output voltage Vwell to the voltage Vh, the monitoring of the first output voltage Vwell is required for clearly preventing the potential reverse of the first and second output voltages Vwell and Vwl from occurring.

Figure 2:
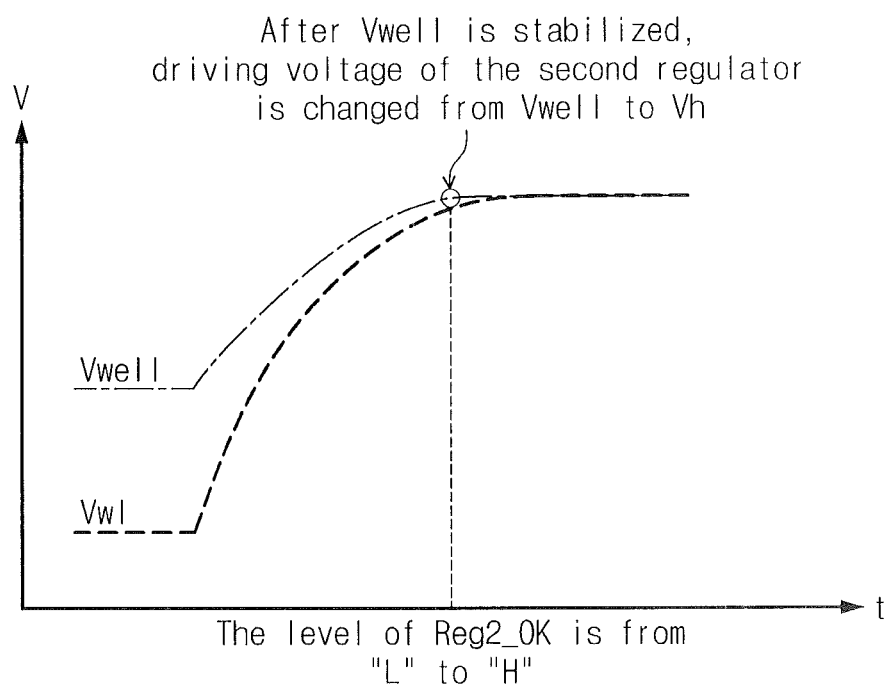
FIG. 2 is a diagram illustrating the time change of the output of the regulator in FIG. 1.

FIG. 2 illustrating the charging of the first and second output voltages of the regulator device in FIG. 1. In FIG. 2, it is shown that the output voltage Vwell of the first regulator 2 and the output voltage Vwl of the second regulator 3 are shifted with time.

In the second regulator 3, first, the second output voltage Vwl is generated by the second voltage generation unit 30 in the charging of a voltage. At this time, the third voltage generation unit 40 is not yet enabled. Subsequently, the first output voltage Vwell is charged by the voltage Vh, and the potential reverse of the first and second output voltages Vwell and Vwl do not occur.

Subsequently, the signal Reg2_OK is shifted from a low level (L) to a high level (H). In this case, the third voltage generation unit 40 is enabled. Afterwards, in the second regulator 3, the third voltage generation unit 40 generates the second output voltage Vwl.

In the regulator device 1 of FIG. 1, it has been described above that the output voltage of the first regulator 2 and the output voltage of the second regulator 3 are respectively used as the well voltage Vwell and source voltage Vwl of FIG. 7. However, this should be understood as an exemplary example. For example, the output voltage of the first regulator 2 and the output voltage of the second regulator 3 may be used as the voltage of a control signal or a power source voltage that is supplied to a memory device or a driving device thereof.

In the regulator device 1 of FIG. 1, it has been described above that the output voltage Vwl of the second regulator 3 is the same as the output voltage Vwell of the first regulator 2. However, this should be understood as an exemplary example. For example, even when the second output voltage Vwl is lower or slight higher than the first output voltage Vwell, an operation may be identically performed.

According to an embodiment of the inventive concept in FIG. 1, the potential of the first output voltage Vwell and the potential of the second output voltage Vwl may be shifted at a high speed while guaranteeing a relationship of "Vwell≧Vwl.

Hereinafter, another embodiment of the inventive concept will be described with reference to FIGS. 3 and 4.

Figure 3:
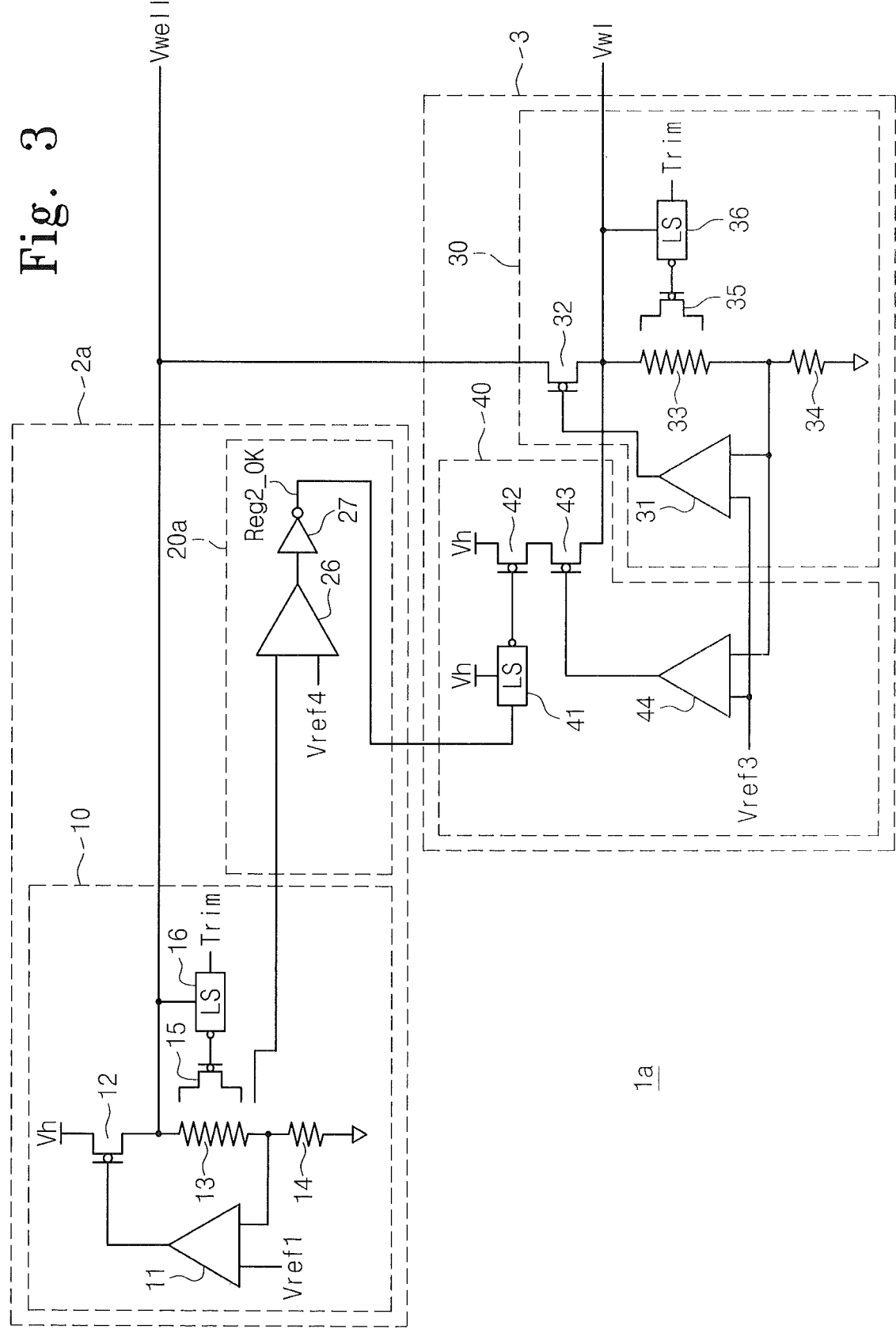
FIG. 3 is a circuit diagram illustrating a regulator according to another embodiment of the inventive concept.

A regulator device 1a in FIG. 3 uses resistors 13 and 14 as resistors that are used for outputting a signal Reg2_OK. A regulator device 1b in FIG. 4 uses controls the third voltage generation unit 40 of FIG. 1 according to the enable signal Enable of an operational amplifier. In FIGS. 3 and 4, for a brief description, the same elements as those of FIG. 1 will be described below using the same reference numerals as those of FIG. 1.

The regulator device 1a of FIG. 3 includes a first regulator 2a corresponding to the first regulator 2 of FIG. 1. The first regulator 2a of FIG. 3 includes a determination unit 20a instead of the determination unit 20 of FIG. 1.

In this case, the determination unit 20a includes a comparator 26 and an inverter 27. A voltage divided by the resistor 13 (or a portion of the resistor 13) and the resistor 14 and a reference voltage Vref4 are connected to the two input terminals of the comparator 26, respectively. The comparator 26 compares the voltage divided by the resistor 13 (or a portion of the resistor 13) and the resistor 14 and the reference voltage Vref4. The comparator 26 outputs a signal having a low level (L) when the divided voltage is greater than the reference voltage Vref4.

The inverter 27 inverts the output of the comparator 26. The output signal of the inverter 27 is a signal Reg2_OK. The signal Reg2_OK is shifted to a high level (H) when the level of a first output voltage Vwell is equal to or higher than a certain level.

Figure 4:
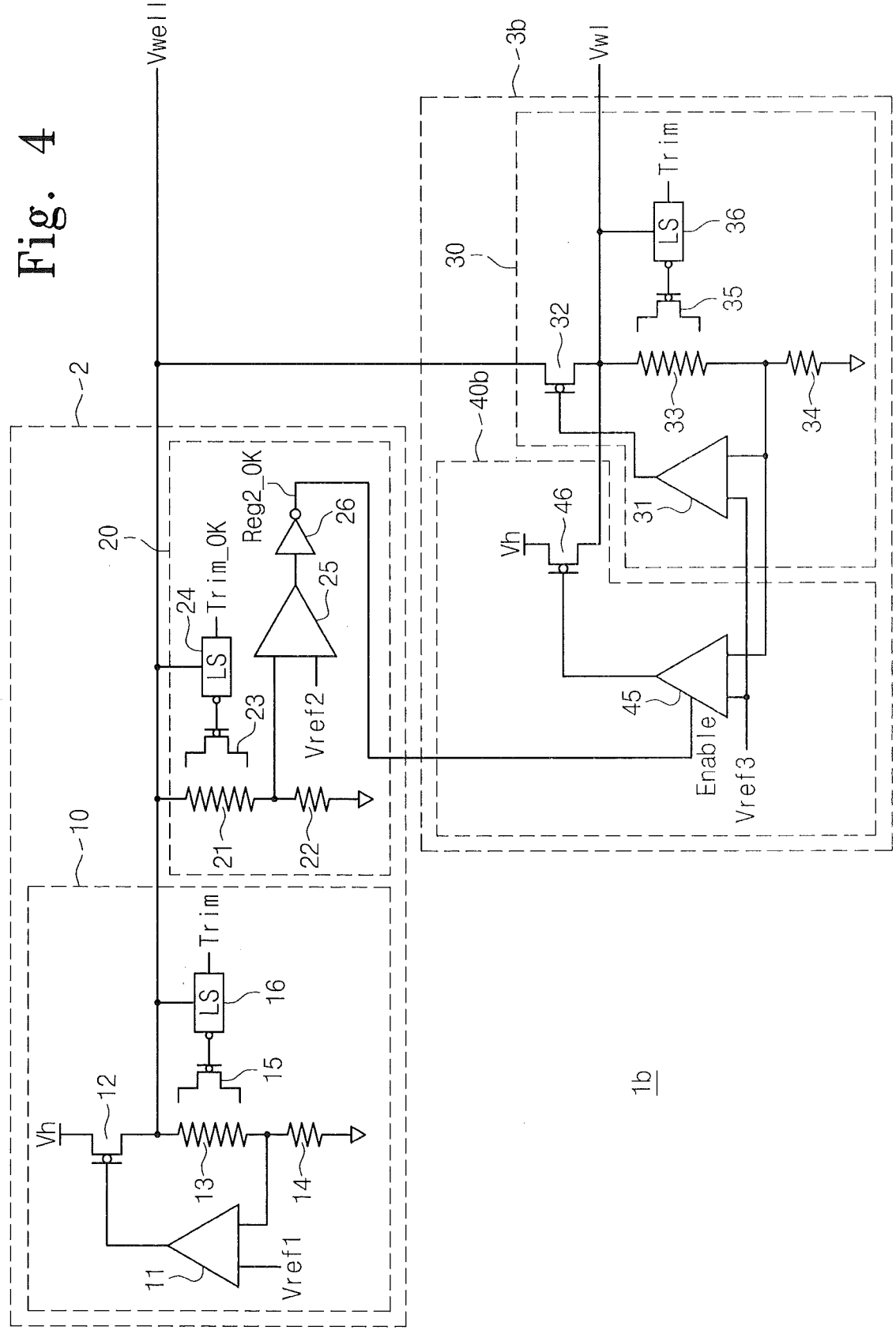
FIG. 4 is a circuit diagram illustrating a regulator according to another embodiment of the inventive concept.
Figure 5:
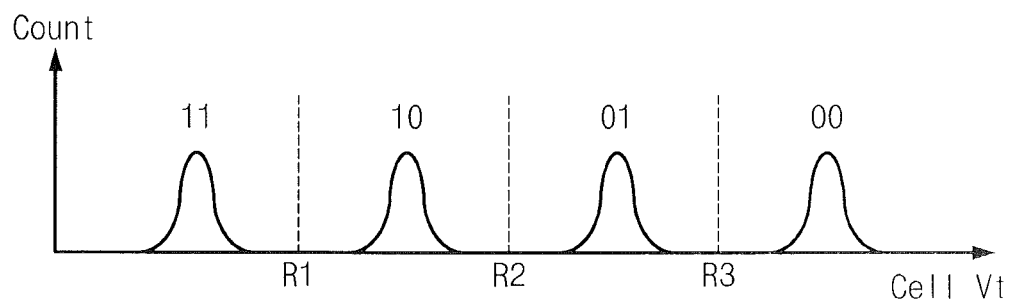
FIG. 5 illustrates a distribution of a threshold voltage of a NOR flash memory using an MLC scheme.
Figure 6:
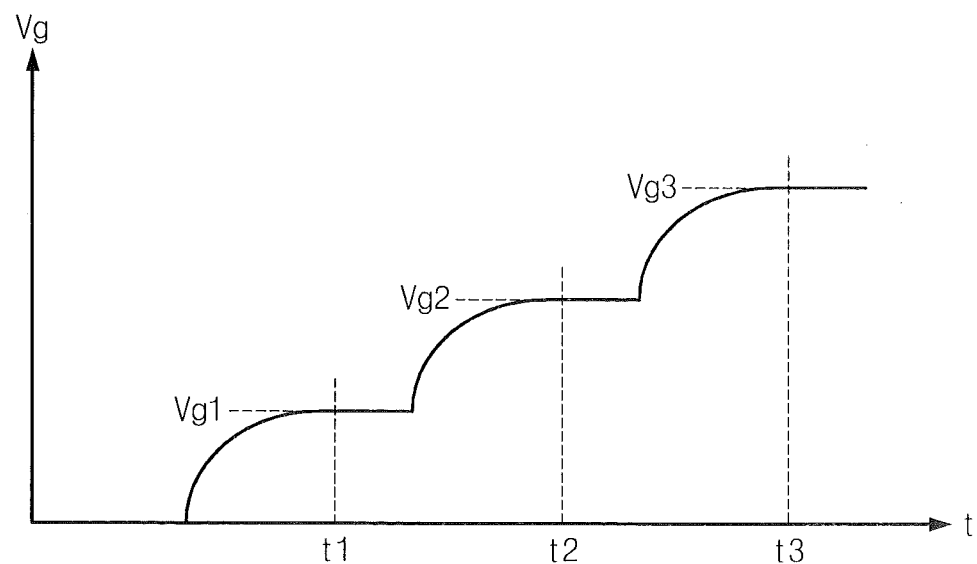
FIG. 6 illustrates a driving example of a word line in an MLC scheme.

The regulator 1b of FIG. 4 includes a second regulator 3b corresponding to the second regulator 3 of FIG. 1. The second regulator 3b of FIG. 4 includes a third voltage generation unit 40b instead of the third voltage generation unit 40 of FIG. 1. The third voltage generation unit 40b includes an operational amplifier 45 and a PMOS transistor 46.

A reference voltage Vref3 is applied to the non-inversion input terminal of the operational amplifier 45. A connection node between serially-connected resistors 33 and 34 is connected to the inversion input terminal of the operational amplifier 45. The output terminal of the operational amplifier 45 is connected to the gate of the PMOS transistor 46.

The operational amplifier 45 includes an enable signal terminal (Enable terminal). The signal Reg2_OK is applied to an enable signal terminal. When the signal Reg2_OK applied to the enable signal terminal has a high level (H), the operational amplifier 45 shifts an output level according to the input level of the inversion input terminal and the input level of the non-inversion input terminal. When the signal Reg2_OK applied to the enable signal terminal has a low level (L), the operational amplifier 45 fixes an output level to the level of a voltage Vh.

That is, when the signal Reg2_OK has a high level (H), the gate voltage of the PMOS transistor 46 is controlled. When the signal Reg2_OK has a low level (L), the PMOS transistor 46 is controlled in a turnoff state.

The source of the PMOS transistor 46 is connected to the voltage Vh. The PMOS transistor 46 is an active load for the second output voltage Vwl. That is, the drain of PMOS transistor 43 is connected to the drain of the PMOS transistor 32 and is the output terminal of the second output voltage Vwl. In the third voltage generation unit 40b, the operational amplifier 45 compares a difference between the reference voltage Vref3 and the second output voltage Vwl, and controls the gate voltage of the PMOS transistor 46 according to the compared result. Accordingly, the second output voltage Vwl is maintained at a constant level.

As described above, embodiments of the inventive concept relate to a semiconductor device including a plurality of regulators that supply a voltage to an internal circuit block. According to embodiments of the inventive concept, specifically, it is premised that a second voltage VA controlled by a second regulator requires a relationship of "VB≧VA" with respect to a first voltage VB controlled by a first regulator.

Herein, the first voltage VB corresponds to the first output voltage Vwell. The second voltage VA corresponds to the second output voltage Vwl.

In this case, the second regulator for controlling the second voltage VA has the following features. At the initial stage of charging, the output voltage VB of the first regulator is used as the output driving power source of the second regulator. When the output voltage VB of the first regulator reaches a certain level, a separate power source higher than the output voltage VB of the first regulator is used as the output driving power source of the second regulator. In this case, for example, when the output voltage VB of the first regulator reaches a certain level, the signal Reg2_OK is shifted to a high level (H). As a result, when the potential of the first voltage VA and the potential of the second voltage VB are shifted at the same time, a power source may be shifted at a high speed while maintaining a relationship of "VB≧VA".

Figure 13:
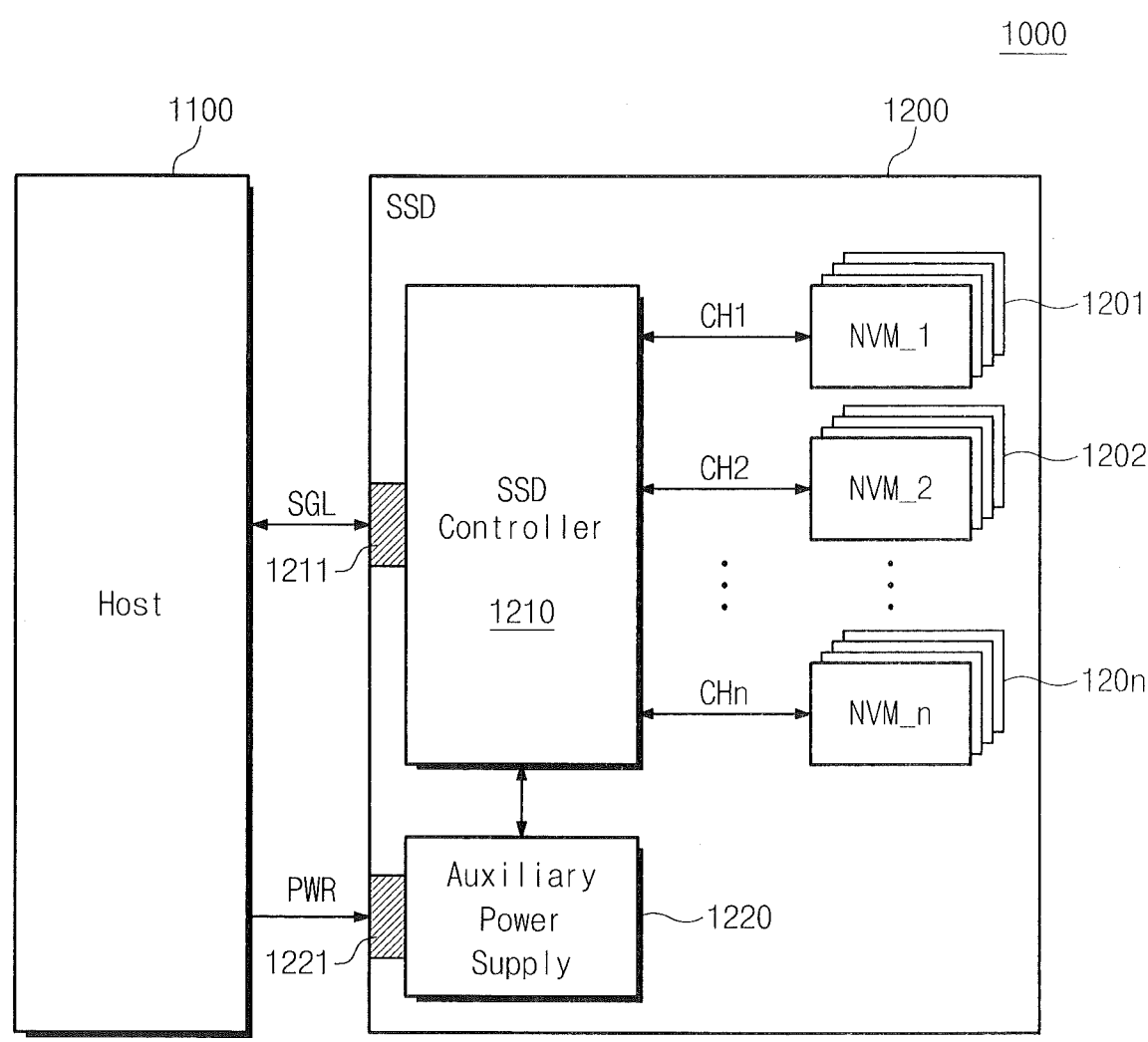
FIG. 13 is a block diagram illustrating a Solid State Disk (SSD) including a regulator device according to an embodiment of the inventive concept.

FIG. 13 is a block diagram illustrating a Solid State Disk (SSD) including a regulator device according to an embodiment of the inventive concept.

Referring to FIG. 13, an SSD system 1000 includes a host 1100 and an SSD 1200. The SSD 1200 exchanges a signal with the host 1100 through a signal connector 1211, and receives a power source through a power connector 1221. The SSD 1200 includes a plurality of nonvolatile memory devices 1201 to 120n, an SSD controller 1210, and an auxiliary power supply 1220.

The nonvolatile memory devices 1201 to 120n are used as the storage medium of the SSD 1200. The nonvolatile memory devices 1201 to 120n may be implemented with a flash memory device having a large-scale storage ability. The SSD 1200 mainly uses a flash memory, but may use a nonvolatile memory device such as Phase-change Random Access Memory (PRAM), Magnetoresistive Random Access Memory (MRAM), ReRAM and Ferroelectric Random Access Memory (FRAM), in addition to the flash memory.

In FIG. 13, at least one nonvolatile memory device may include the regulator devices of FIGS. 1 to 4. For example, when a writing operation is performed, the nonvolatile memory device may shift the level of a power source, which is supplied through a word line, at a high speed.

The nonvolatile memory devices 1201 to 120n may be connected to the SSD controller 1210 through a plurality of channels CH1 to CHn. One or more memory devices may be connected to one channel. Memory devices connected to one channel may be connected to the same data bus.

The SSD controller 1210 exchanges a signal SGL with the host 1100 through the signal connector 1211. Herein, the signal SGL may include a command, an address and data. The SSD controller 1210 writes data in a corresponding memory device or reads data from a corresponding memory device according to the command of the host 1100. The internal configuration of the SSD controller 1210 will be described in detail below with reference to FIG. 14.

The auxiliary power supply 1220 is connected to the host 1100 through the power connector 1221. The auxiliary power supply 1220 may receive a power PWR from the host 1100 and be charged. The auxiliary power supply 1220 may be disposed in the SSD 1200, or may be disposed outside the SSD 1200. For example, the auxiliary power supply 1220 is disposed at a main board, and may supply an auxiliary power source to the SSD 1200.

Figure 14:
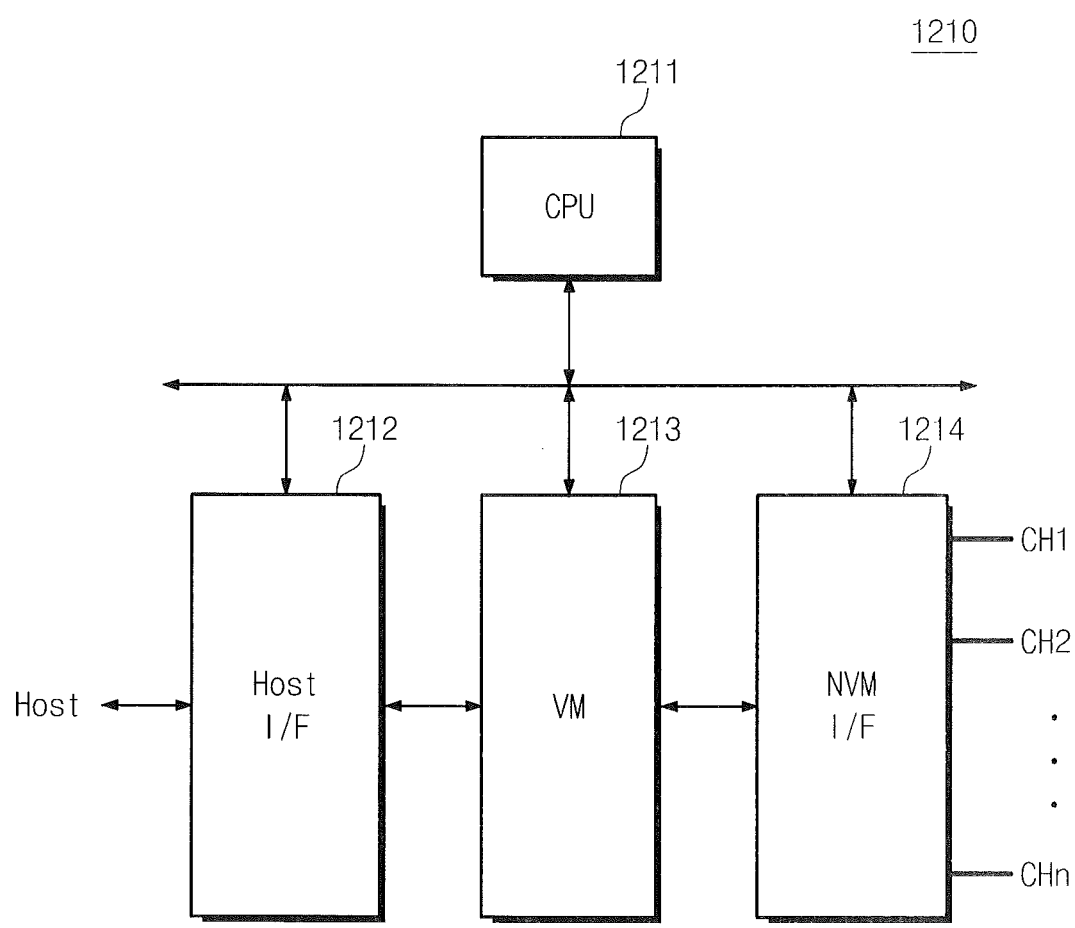
FIG. 14 is a block diagram exemplarily illustrating a configuration of an SSD controller in FIG. 13.

FIG. 14 is a block diagram exemplarily illustrating the configuration of the SSD controller 1210 in FIG. 13.

Referring to FIG. 14, the SSD controller 1210 includes a Central Processing Unit (CPU) 1211, a host interface 1212, a volatile memory device 1213, and an NVM interface 1214.

The CPU 1211 analyzes and processes the signal SGL that is inputted from the host 1100 (see FIG. 13). The CPU 1211 controls the host 1100 or the nonvolatile memory devices 1201 to 120n through the host interface 1212 or the NVM interface 1214. The CPU 1211 controls the operations of the nonvolatile memory devices 1201 to 120n according to firmware for driving the SSD 1200.

The host interface 1212 provides interfacing with the SSD 1200 according to the protocol of the host 1100. The host interface 1212 may communicate with the host 1100 through Universal Serial Bus (USB), Small Component Small Interface (SCSI), Peripheral Component Interconnection (PCI) express, Advanced Technology Attachment (ATA), Parallel-ATA (PATA), Serial-ATA (SATA) and Serial Attached SCSI (SAS). Moreover, the host interface 1212 may perform a disk emulation function of providing support in order for the host 1100 to recognize the SSD 1200 as a Hard Disk Drive (HDD).

The volatile memory device (VM) 1213 temporarily stores a writing data provided from the host 1100 or data that is read from a nonvolatile memory device. The volatile memory device 1213 may store metadata or a cache data to be stored in the nonvolatile memory devices 1201 to 120n. In a sudden power-off operation, the metadata or the cache data stored in the volatile memory device 1213 is stored in the nonvolatile memory devices 1201 to 120n. The volatile memory device 1213 may include a Dynamic Random Access Memory (DRAM) and a Static Random Access Memory (SRAM).

The NVM interface 1214 scatters data, which is transferred from the volatile memory device 1213, to the channels CH1 to CHn. The NVM interface 1214 transfers data, which are read from the nonvolatile memory devices 1201 to 120n, to the volatile memory device 1213. Herein, the NVM interface 1214 may use the interface scheme of a NAND flash memory. That is, the SSD controller 1210 may perform a programming operation, a reading operation or an erasing operation according to the interface scheme of the NAND flash memory.

Figure 15:
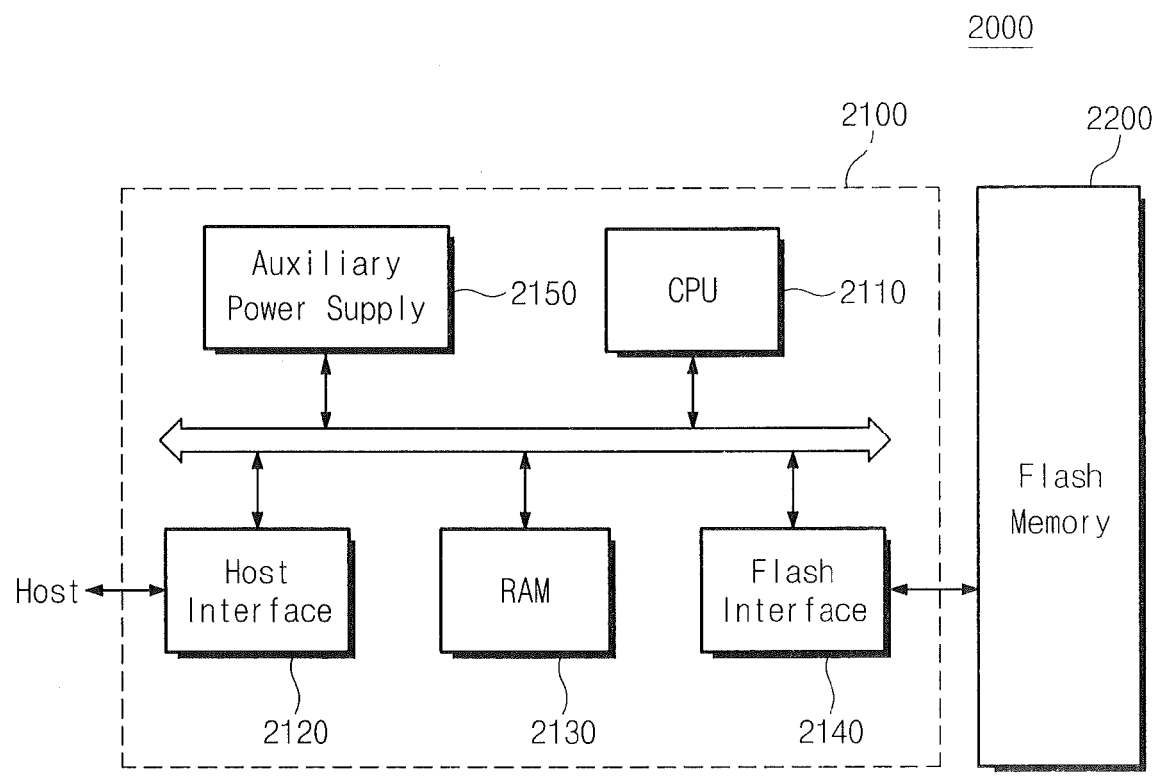
FIG. 15 is a block diagram illustrating a data storage device which includes a nonvolatile memory device according to an embodiment of the inventive concept.

FIG. 15 is a block diagram illustrating a data storage device which includes a nonvolatile memory device according to an embodiment of the inventive concept.

Referring to FIG. 15, a data storage device 2000 includes a memory controller 2100 and a flash memory 2200. The data storage device 2000 includes all storage mediums such as a memory card (for example, SD and MMC) and a mobile storage device (for example, USB memory) capable of attachment/detachment.

The memory controller 2100 includes a CPU 2110, a host interface 2120, a RAM 2130, a flash interface 2140, and an auxiliary power supply 2150. The auxiliary power supply 2150 may be disposed inside/outside the memory controller 2100.

The data storage device 2000 is connected to a host and is used. The data storage device 2000 exchanges data with the host through the host interface 2120, and exchanges data with the flash memory 2200 through the flash interface 2140. The data storage device 2000 receives a power source from the host to perform an internal operation.

The flash memory device of FIG. 15 includes the regulator devices of FIGS. 1 to 4. Accordingly, when a writing operation is performed, the flash memory device 2200 may shift the level of a power source, which is supplied through a word line, at a high speed. Accordingly, the speed of a writing operation can become higher.

Figure 16:
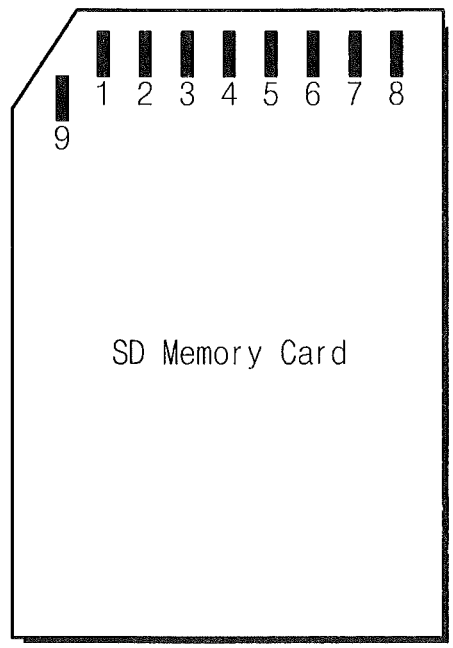
FIG. 16 is a block diagram illustrating a memory card which includes a nonvolatile memory device according to an embodiment of the inventive concept.

FIG. 16 is a block diagram illustrating a memory card which includes a nonvolatile memory device according to an embodiment of the inventive concept. FIG. 16 illustrates the shape of an SD card among memory cards.

Referring to FIG. 16, the SD card is configured with nine pines. The SD card includes four data pins (for example, 1, 7, 8, 9), one command pin (for example, 2), one clock pin (for example, 5) and three power source pins (for example, 3, 4, 6).

Herein, a command and a response signal are transferred through the command pin (pin number 2). Generally, a command is transferred from a host to a memory card, and a response signal is transmitted from the memory card to the host.

Figure 17:
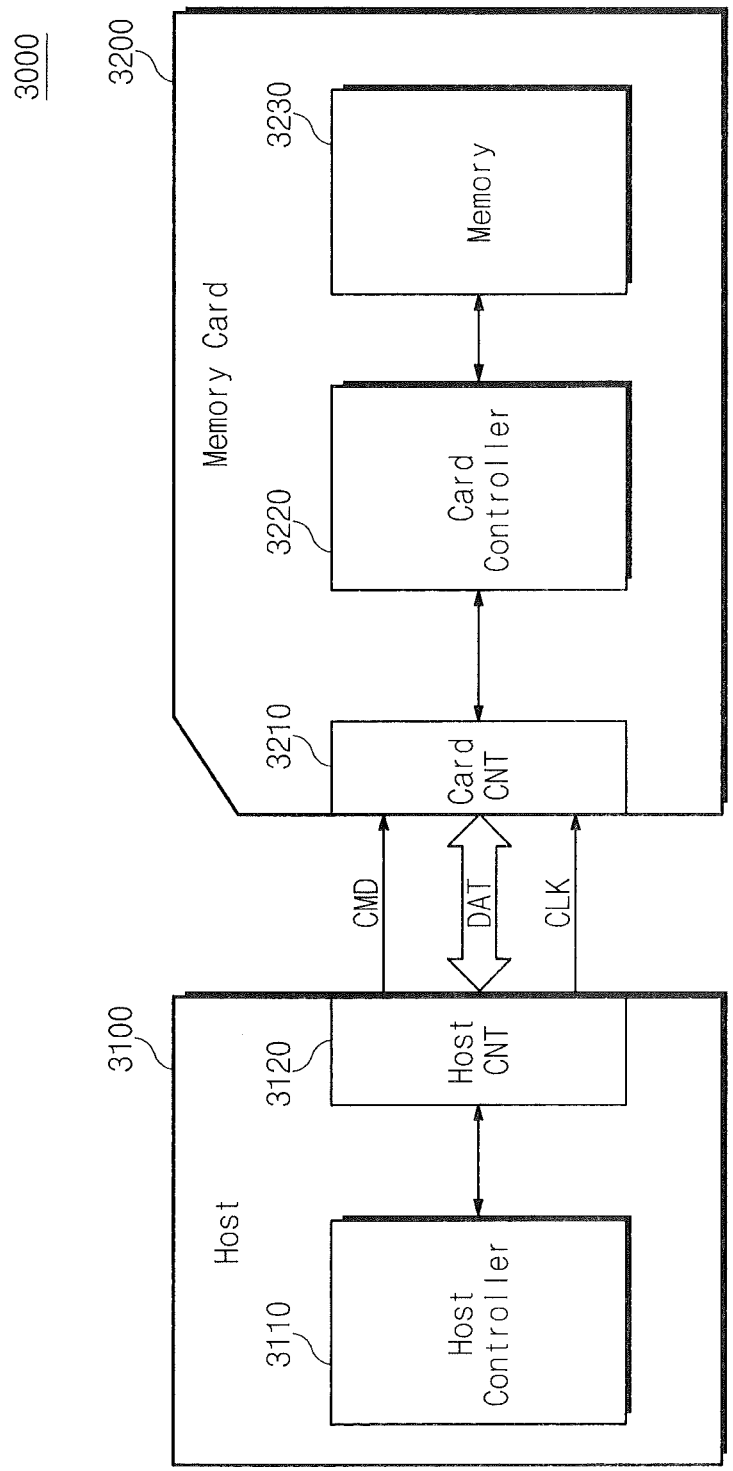
FIG. 17 is a block diagram illustrating an internal configuration of a memory card in FIG. 16 and connection relationship with a host.

FIG. 17 is a block diagram illustrating an internal configuration of the memory card of FIG. 16 and connection relationship with a host.

Referring to FIG. 17, a memory card system 3000 includes a host 3100 and a memory card 3200. The host 3100 includes a host controller 3110 and a host connection unit 3120. The memory card 3200 includes a card connection unit 3210, a card controller 3220, and a memory 3230.

The host connection unit 3120 and the card connection unit 3210 are configured with a plurality of pins. The pins include a command pin, a data pin, a clock pin and a power pin. The number of pins varies with the kind of the memory card 3200. For example, an SD card includes nine pins.

The host 3100 writes data in the memory card 3200, or reads data that is stored in the memory card 3200. The host controller 3110 transmits a command (for example, a writing command), a clock signal CLK that is generated by a clock generator (not shown) in the host 3100 and data DAT to the memory card 3200 through the host connection unit 3120.

The card controller 3220 stores data in the memory 3230 in synchronization with a clock signal that is generated by a clock generator (not shown) in the card controller 3220, in response to a writing command that is received through the card connection unit 3210. The memory 3230 stores data that is transmitted from the host 3100. For example, when the host 3100 is a digital camera, it stores an image data.

Herein, the memory 3230 includes a nonvolatile memory device, and the nonvolatile memory device includes the regulator devices of FIGS. 1 to 4. For example, when a writing operation is performed, the memory 3230 may shift the level of a voltage, which is applied through a word line, at a high speed. Accordingly, the writing operation can quickly be performed.

Figure 18:
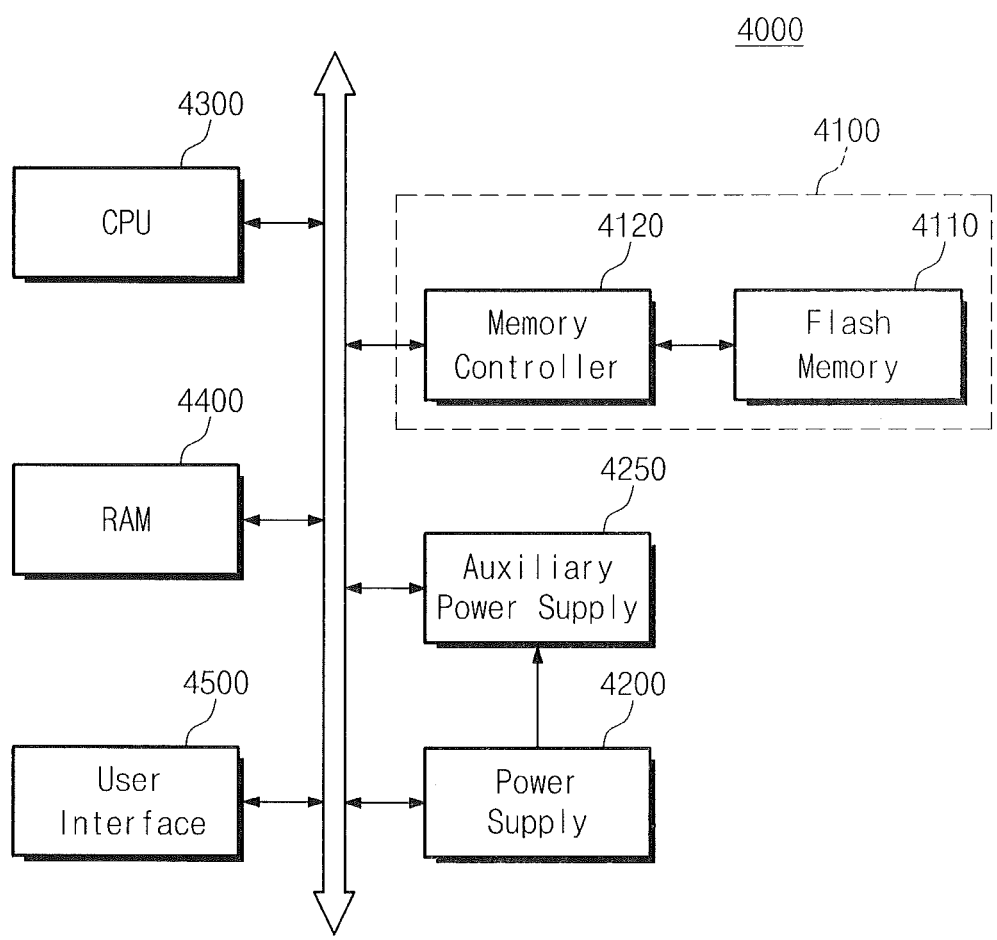
FIG. 18 is a block diagram illustrating an electronic device which includes a nonvolatile memory device according to an embodiment of the inventive concept.

FIG. 18 is a block diagram illustrating an electronic device which includes a nonvolatile memory device according to an embodiment of the inventive concept. An electronic device 4000 may be implemented as a Personal Computer (PC), or may be implemented as a portable electronic device such as a notebook computer, a portable phone, a Personal Digital Assistant (PDA) and a camera.

Referring to FIG. 18, the electronic device 4000 includes a semiconductor memory device 4100, a power supply 4200, an auxiliary power supply 4250, a CPU 4300, a RAM 4400, and a user interface 4500. The semiconductor memory device 4100 includes a flash memory 4110 and a memory controller 4120.

The flash memory 4110 of FIG. 18 includes the regulator devices of FIGS. 1 to 4. For example, when a writing operation is performed, the memory 3230 may shift the level of a voltage, which is applied through a word line, at a high speed. Accordingly, the writing operation can quickly be performed.

The voltage stabilization device according to embodiments of the inventive concept can shift the potential of a second voltage at a high speed while maintaining a relationship of "first voltage≧second voltage". Thus, as illustrated and described herein, an integrated circuit memory device according to an embodiment of the invention includes multiple voltage regulators, which are configured to generate respective boosted voltages. These boosted voltages may be provided to a memory cell block (e.g., nonvolatile memory cell block). As illustrated by FIGS. 1-4, a memory device includes a first voltage regulator 2, which is configured to increase a well voltage (Vwell) from a first level to an elevated second level during a pull-up time interval (see, e.g., FIG. 2) when a boosted well voltage level is required within a memory cell block (e.g., 101-0). This increase in the level of the well voltage may occur in response to a transition of a trim signal (Trim) received at an input of the first voltage regulator 2. A second voltage regulator is also provided. A second voltage regulator 3 is configured to increase a word line voltage (Vwl) from a third level to an elevated fourth level during the pull-up time interval. The second voltage regulator 3 is responsive to the transition of the trim signal and the well voltage. A memory cell block (e.g., 101-0) is configured to receive the well voltage and the word line voltage during the pull-up time interval.

The second voltage regulator 3 is configured to switch from sinking (i.e., receiving) current from the first voltage regulator 2 during a leading portion of the pull-up time interval to sinking current from a power supply line (e.g., Vh) during a trailing portion of the pull-up time interval. The second voltage regulator may include a PMOS pull-up transistor 32 having a source terminal that receives the well voltage (Vwell). The memory cell block 101-0 includes a PMOS pull-up transistor (see, e.g., 120 in FIG. 7) having a source terminal responsive to the word line voltage Vwl, a drain terminal electrically coupled to a word line WL and a substrate bias terminal responsive to the well voltage Vwell. The first voltage regulator 2 is configured to switch a regulator control signal (e.g., Reg2_OK) from a first logic state to a second logic state in response to determining that a voltage level of the well voltage has exceeded a threshold voltage level, which may be detected by a determination unit 20. In response to this transition of the regulator control signal, the second voltage regulator 3 switches from sinking current from the first voltage regulator (e.g., Vwell output line) to sinking current from a power source (e.g., Vh) using at least one PMOS transistor (e.g., 42, 43).

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. An integrated circuit memory device, comprising:
a first voltage regulator configured to increase a well voltage from a first level to an elevated second level during a pull-up time interval, in response to transition of a trim signal received at an input thereof;
a second voltage regulator configured to increase a word line voltage from a third level to an elevated fourth level during the pull-up time interval, in response to the transition of the trim signal and the well voltage; and
a memory cell block configured to receive the well voltage and the word line voltage during the pull-up time interval.

2. The memory device of claim 1, wherein said second voltage regulator is configured to switch from sinking current from said first voltage regulator during a leading portion of the pull-up time interval to sinking current from a power supply line during a trailing portion of the pull-up time interval.

3. The memory device of claim 2, wherein a voltage level of the power supply line is greater than the well voltage during the pull-up time interval.

4. The memory device of claim 2, wherein said second voltage regulator comprises a PMOS pull-up transistor having a source terminal that receives the well voltage.

5. The memory device of claim 4, wherein said memory cell block comprises a PMOS pull-up transistor having a source terminal responsive to the word line voltage, a drain terminal electrically coupled to a word line and a substrate bias terminal responsive to the well voltage.

6. The memory device of claim 5, wherein said memory cell block comprises a non-volatile memory cell having a control terminal electrically coupled to the word line.

7. The memory device of claim 6, wherein the non-volatile memory cell is selected from a group consisting of an EEPROM cell and a charge-trap memory cell.

8. The memory device of claim 4, wherein each of said first and second voltage regulators comprises a respective PMOS pull-up transistor having a source terminal electrically coupled to the power supply line.

9. The memory device of claim 2, wherein said first voltage regulator is configured to switch a regulator control signal from a first logic state to a second logic state in response to determining that a voltage level of the well voltage has exceeded a threshold voltage level; and wherein said second voltage regulator is configured to switch from sinking current from said first voltage regulator to sinking current from a power source in response to the switch of the regulator control signal.

10. A voltage stabilization device, comprising:
a first regulator generating a first voltage; and
a second regulator generating a second voltage lower than the first voltage;
wherein the second regulator generates the second voltage by selectively using the first voltage or a third voltage higher than the first voltage on the basis of a compared result of a level of the first voltage and a level of a predetermined reference voltage;
wherein the first regulator comprises:
a first voltage generation unit generating the first voltage; and
a determination unit determining whether the level of the first voltage reaches the level of the reference voltage;
wherein the second regulator comprises:
a second voltage generation unit receiving the first voltage to generate the second voltage when the level of the first voltage is lower than the level of the reference voltage; and
a third voltage generation unit receiving the third voltage to generate the second voltage when the level of the first voltage reaches the level of the reference voltage; and
wherein the second voltage generation unit comprises a second operational amplification circuit driving a second output transistor on the basis of a second reference voltage, the third voltage generation unit comprises a third operational amplification circuit driving a third output transistor on the basis of the second reference voltage, and an output terminal of the second output transistor is connected to an output terminal of the third output transistor.

11. The voltage stabilization device of claim 10, wherein the second operational amplification circuit drives the second output transistor on the basis of the second reference voltage and a second voltage-divided voltage which is obtained by dividing the second voltage at a second voltage division ratio and the third operational amplification circuit drives the third output transistor on the basis of the second reference voltage and the second voltage-divided voltage.

12. A semiconductor device, comprising:
a memory device; and
a voltage stabilization device supplying a power source voltage or a voltage of a control signal to the memory device;
wherein the voltage stabilization device comprises:
a first regulator generating a first voltage; and
a second regulator generating a second voltage lower than the first voltage, wherein the second regulator generates the second voltage by selectively using the first voltage or a third voltage higher than the first voltage on the basis of a compared result of a level of the first voltage and a level of a predetermined reference voltage; and
wherein the memory device is a nonvolatile memory device using a multi level cell scheme, the first voltage is a well voltage of a PMOS transistor for driving a word line which is connected to the nonvolatile memory device, and the second voltage is a source voltage of the PMOS transistor.

* * * * *